ns>

United States Patent
Parle et al.

(10) Patent No.: US 9,261,568 B2
(45) Date of Patent: Feb. 16, 2016

(54) DIAGNOSTIC METHOD TO MONITOR BATTERY CELLS OF SAFETY-CRITICAL SYSTEMS

(75) Inventors: Robert Parle, Oxford (GB); James Stegen, Chicago, IL (US); Katherine O'Riordan, Raheen (IE)

(73) Assignee: ANALOG DEVICES, INC., Norwood, MA (US)

(*) Notice: Subject to any disclaimer, the term of this patent is extended or adjusted under 35 U.S.C. 154(b) by 519 days.

(21) Appl. No.: 13/182,913

(22) Filed: Jul. 14, 2011

(65) Prior Publication Data

US 2012/0203482 A1   Aug. 9, 2012

Related U.S. Application Data

(60) Provisional application No. 61/440,093, filed on Feb. 7, 2011.

(51) Int. Cl.
  *G01R 31/36* (2006.01)
  *G01R 19/165* (2006.01)

(52) U.S. Cl.
  CPC .......... *G01R 31/3658* (2013.01); *G01R 31/362* (2013.01); *G01R 19/16542* (2013.01)

(58) Field of Classification Search
  CPC .............. G01R 19/0038; G01R 31/36; G01R 31/3606; G01R 31/3637; G01R 31/3658; G01R 31/362; G01R 19/16542; H02J 7/0024
  USPC ....................................................... 702/63
  See application file for complete search history.

(56) References Cited

U.S. PATENT DOCUMENTS

| | | | |
|---|---|---|---|
| 3,740,636 A | | 6/1973 | Hogrefe et al. |
| 4,503,537 A | | 3/1985 | McAnney |
| 4,871,956 A | * | 10/1989 | Barrella .................. 320/135 |
| 4,894,791 A | | 1/1990 | Jiang et al. |
| 5,099,205 A | | 3/1992 | Lewyn |
| 5,359,296 A | | 10/1994 | Brooks et al. |
| 5,532,969 A | | 7/1996 | Houghton et al. |
| 5,677,077 A | | 10/1997 | Faulk |
| 5,784,323 A | | 7/1998 | Adams et al. |
| 5,841,996 A | | 11/1998 | Nolan et al. |
| 6,275,075 B1 | | 8/2001 | Min |

(Continued)

FOREIGN PATENT DOCUMENTS

| | | |
|---|---|---|
| CN | 201174408 Y | 12/2008 |
| WO | 96/21181 | 7/1996 |
| WO | 2008/108979 | 9/2008 |

OTHER PUBLICATIONS

Kudo et al. Machine Translation of "Cell controller for lithium ionbatter using ASIC," Shin-kobe Electric Machinery Co. Ltd. 2006, pp. 16-20.*

(Continued)

*Primary Examiner* — Sujoy Kundu
*Assistant Examiner* — Liam R Casey
(74) *Attorney, Agent, or Firm* — Kenyon & Kenyon LLP

(57) ABSTRACT

System and method to detect battery cell malfunctions through redundant offset battery cell monitoring. Redundant battery monitoring may be implemented in a battery monitoring system to process battery cell voltages at offset times. A processor may compare offset voltage samples for a particular battery cell. If the samples vary outside a predetermined range, the processor may indicate a battery cell malfunction.

22 Claims, 9 Drawing Sheets

(56) References Cited

U.S. PATENT DOCUMENTS

| | | | |
|---|---|---|---|
| 6,762,588 B2 | 7/2004 | Miyazaki et al. | |
| 6,891,352 B2 | 5/2005 | Miyazaki et al. | |
| 6,958,641 B2 | 10/2005 | Lee | |
| 7,859,223 B2 | 12/2010 | Gorbold | |
| 8,384,354 B2 * | 2/2013 | Chandler et al. | 320/132 |
| 2001/0035777 A1 | 11/2001 | Wang et al. | |
| 2003/0044689 A1 | 3/2003 | Miyazaki et al. | |
| 2003/0074505 A1 | 4/2003 | Andreas et al. | |
| 2003/0154426 A1 | 8/2003 | Chow et al. | |
| 2004/0051534 A1 | 3/2004 | Kobayashi et al. | |
| 2004/0160229 A1 | 8/2004 | Fujita et al. | |
| 2005/0206427 A1 | 9/2005 | Yuasa et al. | |
| 2005/0251594 A1 | 11/2005 | Voth et al. | |
| 2005/0253559 A1 | 11/2005 | Felder | |
| 2006/0176096 A1 | 8/2006 | Dreps et al. | |
| 2007/0011542 A1 | 1/2007 | Mukherjee et al. | |
| 2007/0176646 A1 | 8/2007 | Nam et al. | |
| 2007/0182375 A1 | 8/2007 | Lee | |
| 2007/0200434 A1 | 8/2007 | Gottlieb et al. | |
| 2008/0183914 A1 | 7/2008 | Gorbold | |
| 2008/0195904 A1 | 8/2008 | Wang | |
| 2008/0209288 A1 | 8/2008 | Burlison et al. | |
| 2008/0270859 A1 | 10/2008 | Mikami | |
| 2009/0167573 A1 | 7/2009 | Kim et al. | |
| 2009/0302802 A1 | 12/2009 | Miyazaki et al. | |
| 2009/0307548 A1 | 12/2009 | Forlenza et al. | |
| 2010/0175656 A1 * | 7/2010 | Doub | 123/179.3 |
| 2010/0205490 A1 | 8/2010 | Louie et al. | |
| 2010/0244847 A1 | 9/2010 | Kudo et al. | |
| 2010/0277231 A1 | 11/2010 | Hurrell | |
| 2011/0004427 A1 | 1/2011 | Gorbold et al. | |
| 2011/0221469 A1 | 9/2011 | Schlagenhaft | |
| 2011/0254502 A1 * | 10/2011 | Yount et al. | 320/107 |

OTHER PUBLICATIONS

Analog Devices, Inc., Datasheet for "High Voltage Current Shunt Monitor (AD8212)", 2006.

International Search Report and Written Opinion dated Apr. 9, 2012 in PCT/US2012/022163, filed Jan. 23, 2012.

PCT/US2008/002690, Written Opinion, Jun. 10, 2008.

Kudo et al., "Cell controller for lithium ion battery using ASIC", Shin-Kobe Electric Machinery Co. Ltd., 2006, pp. 16-20.

PCT/US2008/001312, Written Opinion, Jun. 13, 2008.

Fairchild Semiconductor, AN-684, "100336 Four-Stage Counter/Shift Register", Feb. 1990; Revised May 2002, pp. 1-7.

Lin, "Implementing a Register File," Sep. 16, 2003, [retrieved on Feb. 8, 2015], retrieved from the Internet:"https://web.archive.org/web/20030916213224/http://www.cs.umd.edu/class/spring2003/cmsc311/Notes/Build/implRegFile.html", 6 pages.

* cited by examiner

200

300

400

500

600

700

800

900

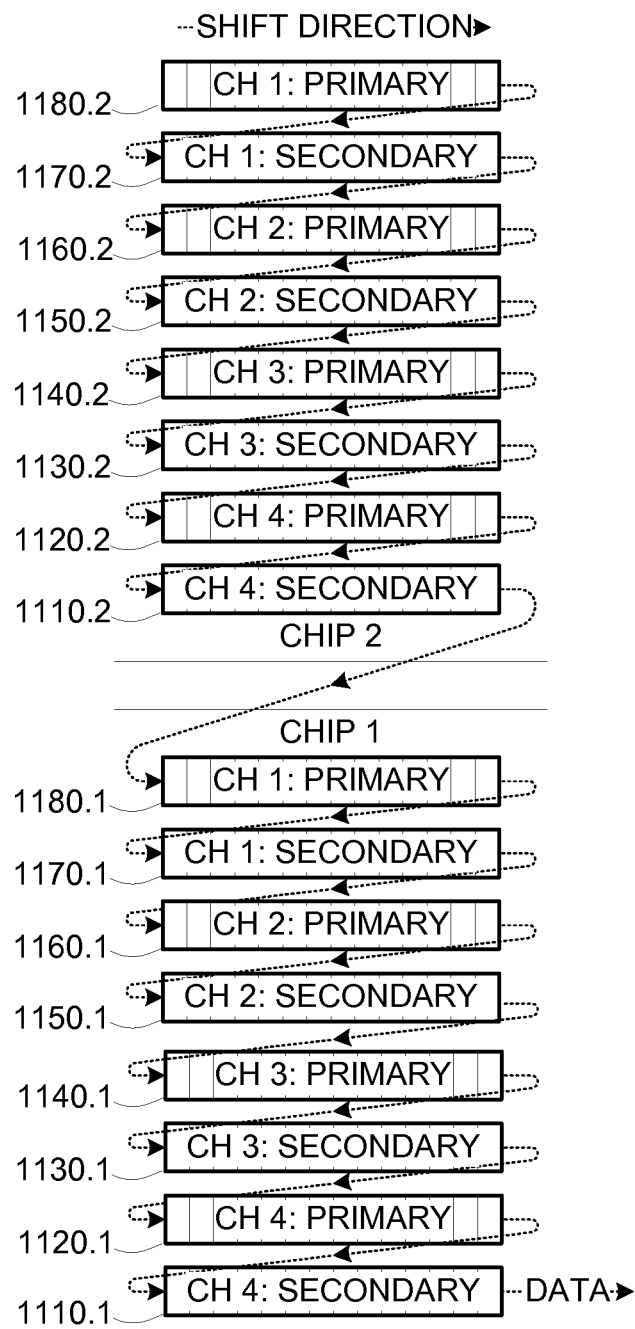

DIAGNOSTIC METHOD TO MONITOR BATTERY CELLS OF SAFETY-CRITICAL SYSTEMS

RELATED APPLICATION

This application claims the benefit of priority afforded by U.S. provisional patent application Ser. No. 61/440,093, filed on Feb. 7, 2011. This application relates to application "Diagnostic Method to Check for Stuck Bits in Storage Registers of Safety-Critical Systems,", filed as U.S. patent application Ser. No. 13/182,884, filed on Jul. 14, 2011.

BACKGROUND

Battery monitors are devices that monitor and report battery cell diagnostic information. A system for monitoring battery cell voltage levels may include battery monitors that may process and report voltage levels for a particular battery cell. Successive reported voltages may be compared to validate operation of a particular battery cell. Although battery monitors provide an efficient mechanism for monitoring battery cell voltage levels, their electrical characteristics may make them susceptible to electrical operating malfunctions that may be caused by induced electromagnetic field voltages, system glitches, voltage spikes, or any number of voltage nonlinearities. In a battery monitoring system, such a nonlinearity may be induced by a battery cell being monitored and may indicate a battery malfunction. When such a malfunction occurs, however, it may interfere with battery monitor operation in a manner such that a battery monitoring system may not properly detect the malfunction. Accordingly, there is a need in the art for a battery monitoring system that may properly detect a battery cell malfunction.

BRIEF DESCRIPTION OF THE DRAWINGS

FIG. 11 illustrates exemplary register shifting operations performed on shift registers of a plurality of battery monitors according to an embodiment of the present invention.

DETAILED DESCRIPTION

Embodiments of the present invention may provide techniques to detect battery malfunctions through redundant offset battery cell monitoring. According to such embodiments, redundant battery monitoring may be implemented in a battery monitor system to process battery cell voltages at offset times. A processor may compare offset voltage samples for a particular battery cell. If the samples vary outside a predetermined range, the processor may indicate a battery cell malfunction.

Figure 1:
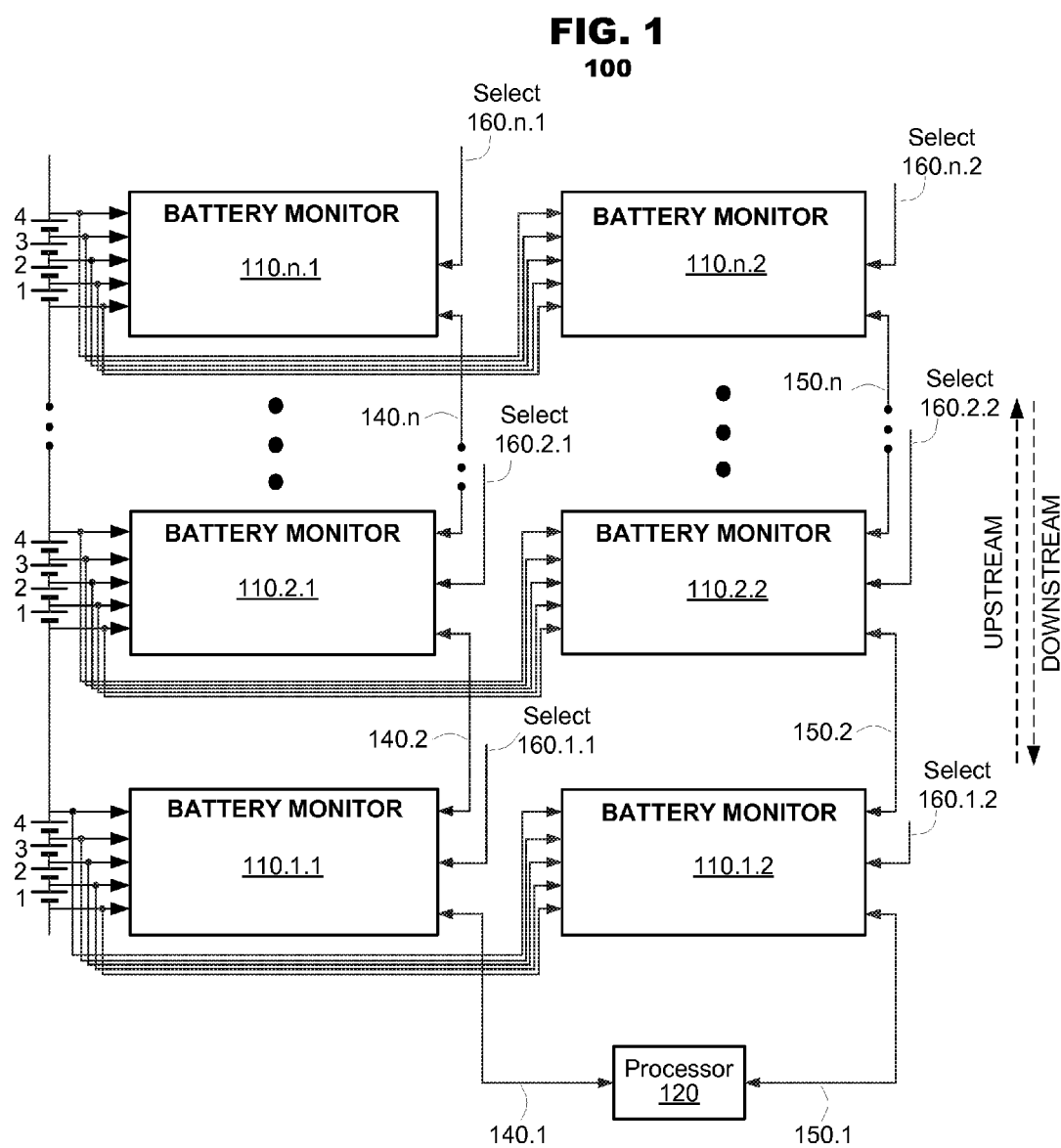
FIG. 1 illustrates a block diagram of a battery monitoring system according to an embodiment of the present invention.

FIG. 1 illustrates a block diagram of a battery monitoring system 100 according to an embodiment of the present invention. The monitoring system 100 may include a plurality of primary battery monitors 110.1.1-110.$n$.1, a plurality of secondary battery monitors 110.1.2-110.$n$.2, and a processor 120. Each battery monitor may further have a pin for a select signal, for example pin 160.1.1 for primary monitor 110.1.1. The primary and secondary battery monitors, for example 110.1.1, 110.1.2, may be situated as a redundant set coupled in parallel to respective cells of a battery system. The primary monitor 110.1.1 may be coupled to the processor 120 via a primary communication link 140.1 while the secondary monitor 110.1.2 may be coupled to the processor 120 via a secondary communication link 150.1. Successive primary 140.2-140.$n$ and secondary 150.2-150.$n$ communication links may connect to each of a successive primary battery monitor 110.2.1-110.$n$.1 and secondary battery monitor 110.2.2-110.$n$.2. The monitoring system 100 may be implemented as a single integrated circuit chip or a plurality of integrated circuit chips.

Each battery monitor in a redundant set may be configured to accept inputs from a predetermined number of battery cells and may activate an input pair associated with a battery cell (a battery "channel") for processing. For example, the configuration as described in FIG. 1 illustrates battery monitors with five inputs, which may provide capability to process data from four different battery cells. In this regard, the primary battery monitors 110.1.1-110.$n$.1 and the secondary battery monitors 110.1.2-110.$n$.2 may be considered to be four channel devices. Other implementations may be provided having a different number of channels than illustrated. The system 100 may be implemented as a single integrated circuit chip or a plurality of integrated circuit chips.

Each of a primary and secondary battery monitor in a redundant set, for example, 110.1.1, 110.1.2, may process battery channel data in an order according to a control code sequence. The control code sequence may be a numerical list of battery channel numbers (i.e., 1, 2, 3, 4). Starting at a predetermined channel, each battery monitor may cycle through a control code sequence in a "round-robin" manner and process data for respective selected channels. Processing may include each battery monitor 110.1.1, 110.1.2 sampling and storing a voltage for each of a battery channel through each cycle of the control code sequence. Each monitor 110.1.1, 110.1.2 may communicate stored voltages to the processor 120 in an order based on the control code sequence for the respective monitor. The processor 120 may then compare successive voltages for each battery channel 110.1.1, 110.1.2 to determine if any of the channels has malfunctioned.

In an embodiment, the primary and secondary monitors in the set 110.1.1, 110.1.2 may be configured to process channel 1 at times offset from each other. Thus, a primary battery monitor 110.1.1 may sample channel 1 at the same time the secondary monitor 110.1.2 may sample channel 4. In this manner, the battery monitors may provide improved immunity to voltage spikes, electromagnetic field voltages, or other operating nonlinearities that can induce errors in other battery monitoring systems.

For example, the primary battery monitor 110.1.1 may begin by processing a channel 1 voltage based on a first control code sequence offset while the secondary battery monitor 110.1.2 may begin by processing a channel 3 voltage based on a second control code sequence offset. If a malfunction should occur for channel 1 while the primary battery monitor 110.1.1 may process that channel, an erroneous voltage might be sampled and stored by the primary battery monitor 110.1.1. However, the secondary battery monitor (starting at channel 3) 110.1.2 may not process channel 1 for two processing cycles When the secondary battery monitor 110.1.2 may process the channel 1 voltage, it may sample and store a voltage for the channel that doesn't include the erroneous voltage caused by the previous malfunction. After both the primary and secondary battery monitors 110.1.1, 110.1.2 may process channel 1, the data stored within each monitor may be read out and compared by the processor 120. The comparison may yield a result that indicates inconsistent voltage levels between the voltages reported by the redundant monitors and the system 100 may therefore detect that battery channel 1 may be malfunctioning.

Successive primary and secondary communication links 140.2, 150.2-140.n, 150.n may operate in "daisy chain" fashion in which the processor 120 may connect to the initial primary battery monitor 110.1.1 by the primary serial link 140.1. The first primary battery monitor 110.1.1 may connect to the subsequent primary battery monitor 110.2.1 via a subsequent serial link 140.2. For the secondary monitors, the processor 120 may connect to the initial secondary battery monitor 110.1.2 by the secondary serial link 150.1. The initial secondary battery monitor 110.1.2 may connect to the subsequent secondary battery monitor 110.2.2 via a subsequent serial link 150.2.

Battery monitors at intermediate positions within the primary or secondary daisy chain may connect to a downstream battery monitor by one serial link and to an upstream battery monitor by a second serial link. For example, the final primary battery monitor 110.n.1 may connect to a prior primary battery monitor by a final primary serial link 140.n. Similarly, the final secondary battery monitor 110.n.2 may connect to a prior secondary battery monitor by a final secondary serial link 150.n.

The serial links may define a communication flow in two directions. Communication may flow in an upstream direction wherein processor commands are relayed from the processor 120 to an initial primary battery monitor (e.g., 110.1.1) and relayed among the battery monitors until they reach the final upstream primary battery monitor in the chain (e.g., 110.n.1). Communication may flow in a downstream direction wherein any battery monitor (say, monitor 110.2.2) may transmit a message and convey it to an adjacent battery monitor (monitor 110.1.2) in the direction of the processor. Intermediate battery monitors may relay the message down the daisy chain until a final downstream battery monitor (e.g., monitor 110.1.2) delivers the message to the processor.

In this regard, the primary battery monitors 110.1.1-110.n.1 and the secondary battery monitors 110.1.2-110.n.2 may include transceiver circuitry to manage communication flow across the communication links 140.1-140.n and 150.1-150.n respectively, not shown in FIG. 1. Further description of the transceiver circuitry may be found in U.S. Publication No. 2008/0183914 and No. 2010/0277231, which is incorporated by reference herein.

Figure 2:
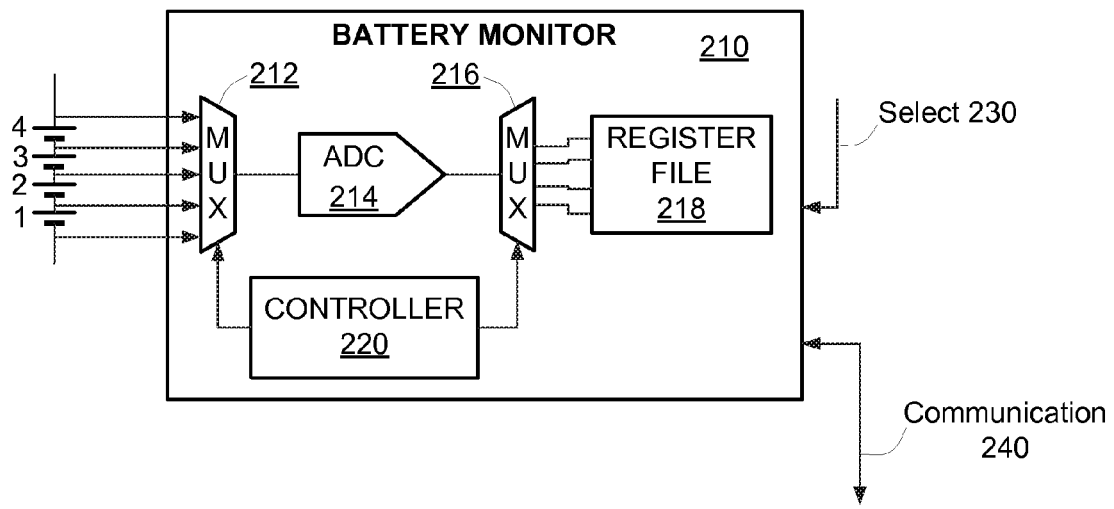
FIGS. 2-3 illustrate block diagrams of battery monitor setups according to an embodiment of the battery monitoring system of FIG. 1.

FIG. 2 illustrates a block diagram of a battery monitor setup 200 according to an embodiment of the battery monitoring system of FIG. 1. In an embodiment, a battery monitor 210 may include a first and second multiplexer (MUX) 212, 216, an analog-to-digital-converter (ADC) 214, a register file 218, and a controller 220. The battery monitor 210 may further include a select pin 230 for receiving a logic signal and a serial communication port 240 for receiving and transmitting communication signals. The first MUX 212 may have inputs coupled to respective battery cells, an input for receiving a control signal, and an output for a signal representing battery cell voltages. The ADC 214 may have an input coupled to the first MUX 212 output and an output for a signal representing digital samples of battery cell voltages. The second MUX 216 may have an input coupled to the ADC 214, an input for receiving a control signal, and outputs for signals representing digital samples of battery cell voltages. The register file 218 may be organized with parallel shift registers, each having an input coupled to a respective output from the second MUX 216 and may store digital samples of battery cell voltages in the registers.

Based on a control code sequence for the battery monitor 210, the controller 220 may select battery channels via the first and second MUX 212, 216 that may be processed by the battery monitor 210. The register file 218 may have a number of registers in proportion to the number of channels supported by the battery monitor 210 (e.g., four registers for a four channel device). Other implementations may be provided having a different number of channels than illustrated.

Various embodiments may be implemented to initialize a control code sequence offset for a battery monitor 210. In an embodiment, a processor (not shown) may load a control code sequence having a prescribed offset (e.g., 1, 2, 3, 4 corresponding to battery channel numbers) to the battery monitor 210. In another embodiment, the battery monitor 210 may be programmed with a control code sequence having a prescribed first and second offset. The select pin 230 may be toggled to initialize either the first or second offset for the monitor 210. For example, the select pin 230 may be toggled low (e.g., '0') and may initialize the monitor 210 to begin processing respective channels at a first offset of channel 1. Conversely, the select pin 230 may be toggled high (e.g., '1') for the monitor 210 and may initialize the monitor to begin processing respective channels at a second offset of channel 3. Other implementations may be provided having a different number of channels as well as a different low/high, start/offset channel configurations than described.

During operation, the first MUX 212 may pass a battery channel voltage to the ADC 214 as activated by the controller 220. The ADC 214 may sample the channel voltage and convert the voltage to a digital value. The ADC 214 may output the sampled digital value to the second MUX 216. The second MUX 216 may pass the sampled digital value to a register offset within the register file 218 as activated by the controller 220. Following the control code sequence, the battery monitor 210 may cycle through and process voltage values of each battery channel in turn. The digital values may be read from the register file 218 by a processor (not shown) for use in voltage comparisons.

Figure 3:
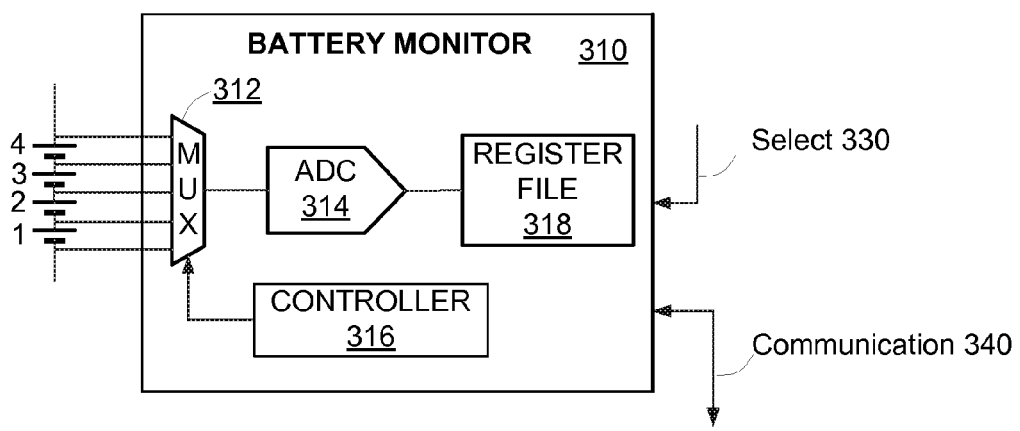

FIG. 3 illustrates a block diagram of another battery monitor setup 300 according to an embodiment of the battery monitoring system of FIG. 1. The battery monitor 310 may include a MUX 312, an ADC 314, a register file 318, and a controller 316. The battery monitor 310 may further include a select pin 330 for receiving a logic signal and a communication port 340 for receiving and transmitting communication signals. The battery monitor 310 may be configured and operate similar to battery monitor 200 of FIG. 2. However, the register file 318 may be organized with serial shift registers, having an input coupled to the ADC 314 output and may store digital samples of battery cell voltages in the registers in a serial manner. The digital values may be read from the register file 318 by a processor (not shown) for use in voltage comparisons.

Based on a control code sequence for the battery monitor 310, the controller 316 may select battery channels via the first MUX 312 that may be processed by the battery monitor 310. The register file 318 may have a number of registers in proportion to the number of channels supported by the battery monitor 310 (e.g., four registers for a four channel device). Other implementations may be provided having a different number of channels than illustrated.

Various embodiments may be implemented to initialize a control code sequence offset for a battery monitor 310. In an embodiment, a processor (not shown) may load a control code sequence having a prescribed offset (e.g., 1, 2, 3, 4 corresponding to battery channel numbers) to the battery monitor 310. In another embodiment, the battery monitor 310 may be programmed with a control code sequence having a prescribed first and second offset. The select pin 330 may be toggled to initialize either the first or second offset for the monitor 310. For example, the select pin 330 may be toggled low (e.g., '0') and may initialize the monitor 310 to begin processing respective channels at a first offset of channel 1. Conversely, the select pin 330 may be toggled high (e.g., '1') for the monitor 310 and may initialize the monitor to begin processing respective channels at a second offset of channel 3. Other implementations may be provided having a different number of channels as well as a different low/high, start/offset channel configurations than described.

Figure 4:
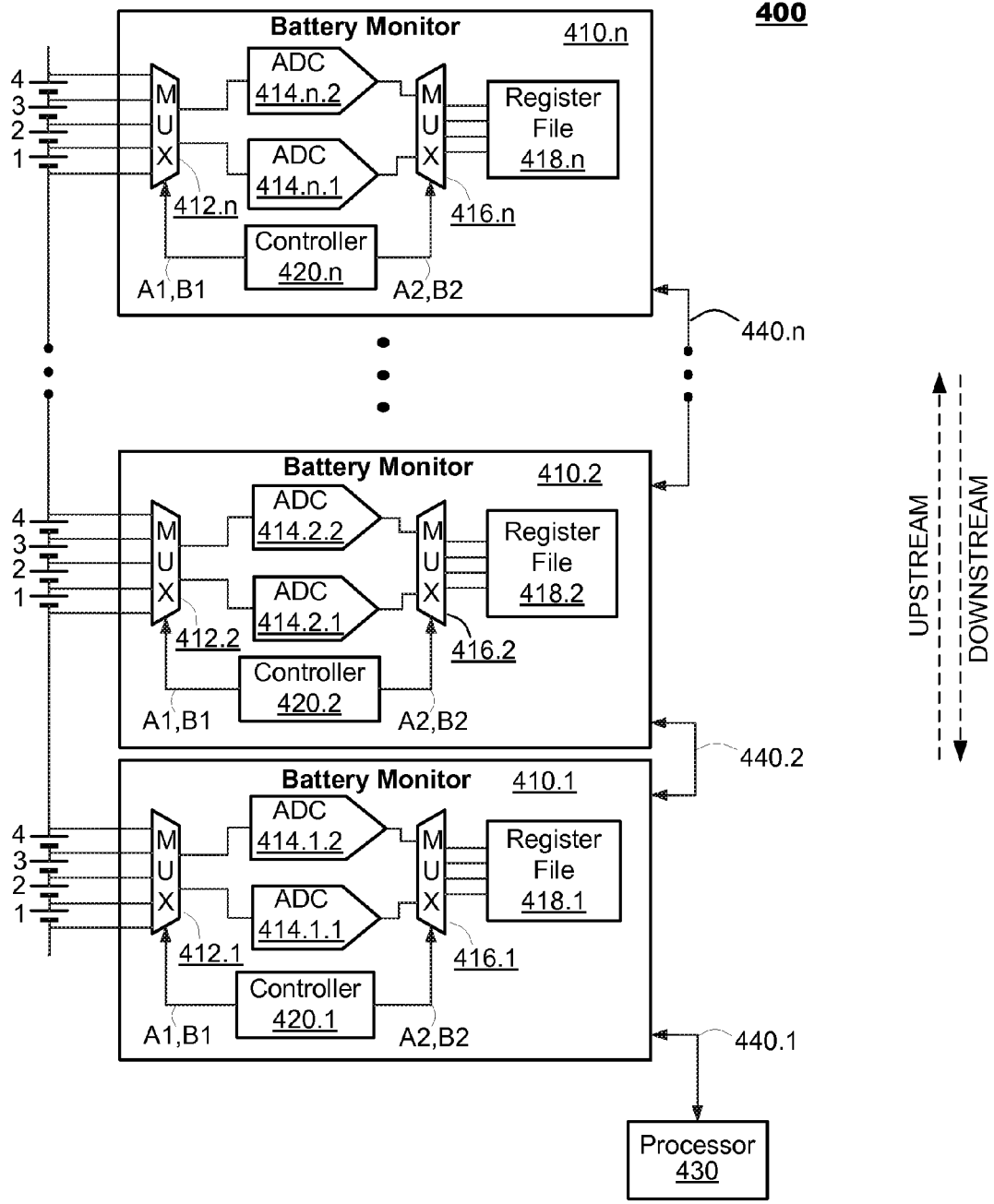
FIG. 4 illustrates a block diagram of a battery monitoring system according to an embodiment of the present invention.

FIG. 4 illustrates a block diagram of a battery monitoring system 400 according to an embodiment of the present invention. The monitoring system 400 may include a plurality of battery monitors 410.1-410.$n$, and a processor 430. A first battery monitor in the plurality of monitors, (say, battery monitor 410.1) may be coupled to the processor 430 via a primary communication link 440.1. Successive battery monitors 410.2-410.$n$ may be implemented for monitoring a varying number of battery cells in a battery stack. Successive communication links 440.2-440.$n$ may be implemented to the successive battery monitors. The system 400 may be implemented as a single integrated circuit chip or a plurality of integrated circuit chips.

The monitoring system 400 may operate and serially communicate to the processor 430 in a manner largely similar to the monitoring system of FIG. 1. However, each of a battery monitor 410.1-410.$n$ may provide internal redundant monitoring rather than implementing redundant sets of primary and secondary monitors. In this manner, each of a battery monitor 410.1-410.$n$ in the monitoring system 400 may provide independent processing paths for redundant battery cell monitoring.

In an embodiment, a battery monitor (say, monitor 410.1) may include a first multiplexer (MUX) 412.1, a first and second analog-to-digital converter (ADC) 414.1.1, 414.1.2, a second MUX 416.1, a register file 418.1, and a controller 420.1. The battery monitor 410.1 may further include a communication port 440.1 for receiving and transmitting serial communication signals to the processor 430. The first MUX 412.1 may have inputs coupled to respective battery cells and control inputs for receiving control signals. The first and second ADCs 414.1.1, 414.1.2 may each have an input coupled to a respective first MUX 412.1 output and a respective output for a signal representing digital samples of battery cell voltages. The second MUX 416.1 may have respective inputs coupled each of the respective ADC 414.1.1, 414.1.2 outputs and control inputs for receiving control signals. The register file 418.1 may be organized with parallel shift registers, each having an input coupled to a respective output from the second MUX 416.1 and may store digital samples of battery cell voltages in the registers.

The controller 420.1 may have output control signals A1 and A2 associated the first ADC 414.1.1 that may activate respective battery channel selection for the ADC 414.1.1 and register storage via the respective first and second MUX 412.1, 416.1. The controller 420.1 may further have output control signals B1 and B2 associated with the second ADC 414.1.2 that may activate respective battery channel selection for the ADC 414.1.2 and register storage via the respective first and second MUX 412.1, 416.1.

Each battery monitor 410.1-410.$n$ may be configured to accept inputs from a predetermined number of battery cells (channels). Each of the first and second ADC within a monitor, for example, first and second ADC 414.1.1, 414.1.2 within monitor 410.1, may sample battery channel data in an order according to a control code sequence. The sampled data may be stored in the register file 418.1. The register file 418.1 may have a number of registers in proportion to the number of processing paths and channels supported by the monitor 410.1 (e.g., eight registers for two-four channel paths). Other implementations may be provided having a different number of channels than illustrated. The system 400 may be implemented as a single integrated circuit chip or a plurality of integrated circuit chips.

Various embodiments may be implemented for initializing a first and second control code offset for each of a first and second ADC within each of battery monitor 410.1-410.$n$. In an embodiment, a controller (say, controller 420.1) may load two separate control code sequences such that neither of the first or second ADC 414.1.1, 414.1.2 may sample and store the same battery channel at the same time. In another embodiment, the controller 420.1 may be programmed with both a control code sequence and a hard-coded first and second offset for each of the first and second ADC 414.1.1, 414.1.2. In yet another embodiment, each battery monitor may be programmed with a predetermined control code sequence having a prescribed first and second offset. A controller (say, controller 420.1) may initialize the first control code offset for activating cells for sampling by the first ADC 414.1.1 and may initialize the second control code offset for activating cells for sampling by the second ADC 414.1.2. Other implementations may be provided wherein the association of a first or second offset to a first or second ADC may be a system-configurable feature.

Figure 5:
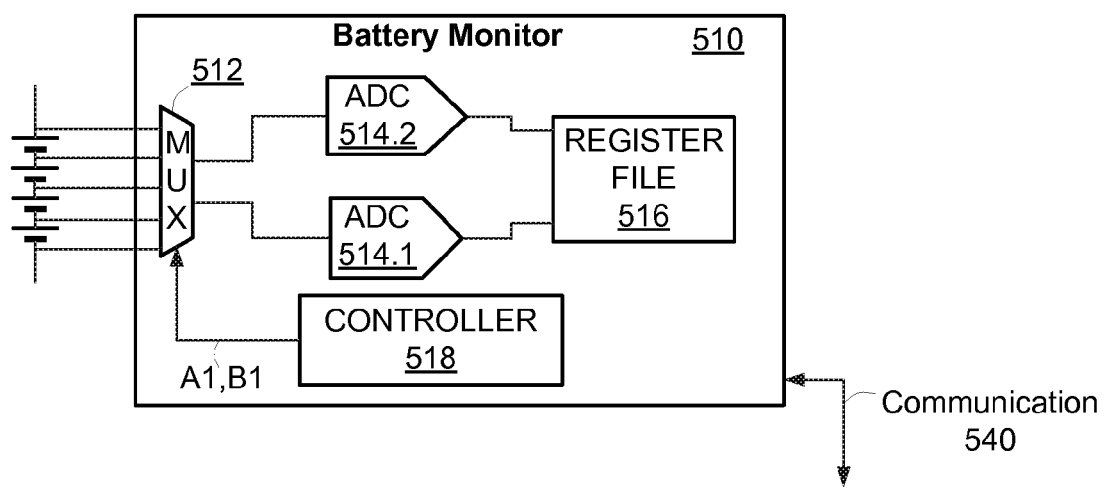
FIG. 5 illustrates a block diagram of a battery monitor setup according to an embodiment of the battery monitoring system of FIG. 4.

FIG. 5 illustrates a block diagram of a battery monitor setup 500 according to an embodiment of the battery monitoring system of FIG. 4. In an embodiment, a battery monitor 510 may include a MUX 512, a first and second ADC 514.1, 514.2, a register file 516, and a controller 518. The battery monitor 510 may have a communication port 540 for receiving and transmitting communication signals. The MUX 512 may have inputs coupled to respective battery cells, control inputs for receiving control signals, and outputs for signals representing battery cell voltages. The first and second ADC 514.1, 514.2 may each have an input coupled to a respective MUX 512 output and a respective output for a signal representing digital samples of battery cell voltages. The register file 516 may be organized with serial shift registers having inputs coupled to respective output from the first and second ADC 514.1, 514.2 and may store digital samples of battery cell voltages in the registers. The controller 518 may have outputs for signals representing control signals A1, B1 that may be coupled to the MUX 512.

The battery monitor 510 may operate and serially communicate to a processor (not shown) in a manner largely similar to the battery monitors as described in FIG. 4. However, the monitor 510 may not implement a second MUX between each ADC 514.1, 514.2 and the register file 516. Rather, each ADC 514.1, 514.2 may feed data directly to the register file 516 in a serial manner for storage. It will be appreciated that it is within the scope of the present invention that the number of ADC's that may be in connection to a number of battery channels to be monitored may be varied in proportion to the number of battery channels present in a battery monitoring system. Further, it will be appreciated that it is within the scope of the present invention that a MUX need not be present to connect a number of ADC's in a battery monitor to a number of battery channels to be monitored.

Various embodiments may be implemented for initializing a first and second control code offset for each of a first and second ADC within a battery monitor 510. In an embodiment, the controller 518 may load two separate control code sequences such that neither of the first or second ADC 514.1, 514.2 may sample and store the same battery channel at the same time. In another embodiment, the controller 518 may be programmed with both a control code sequence and a hard-coded first and second offset for each of the first and second ADC 514.1, 514.2. In yet another embodiment, each battery monitor may be programmed with a predetermined control code sequence having a prescribed first and second offset. The controller 518 may initialize the first control code offset for activating cells for sampling by the first ADC 514.1 and may initialize the second control code offset for activating cells for sampling by the second ADC 514.2. Other implementations may be provided wherein the association of a first or second offset to a first or second ADC may be a system-configurable feature.

Figure 6:
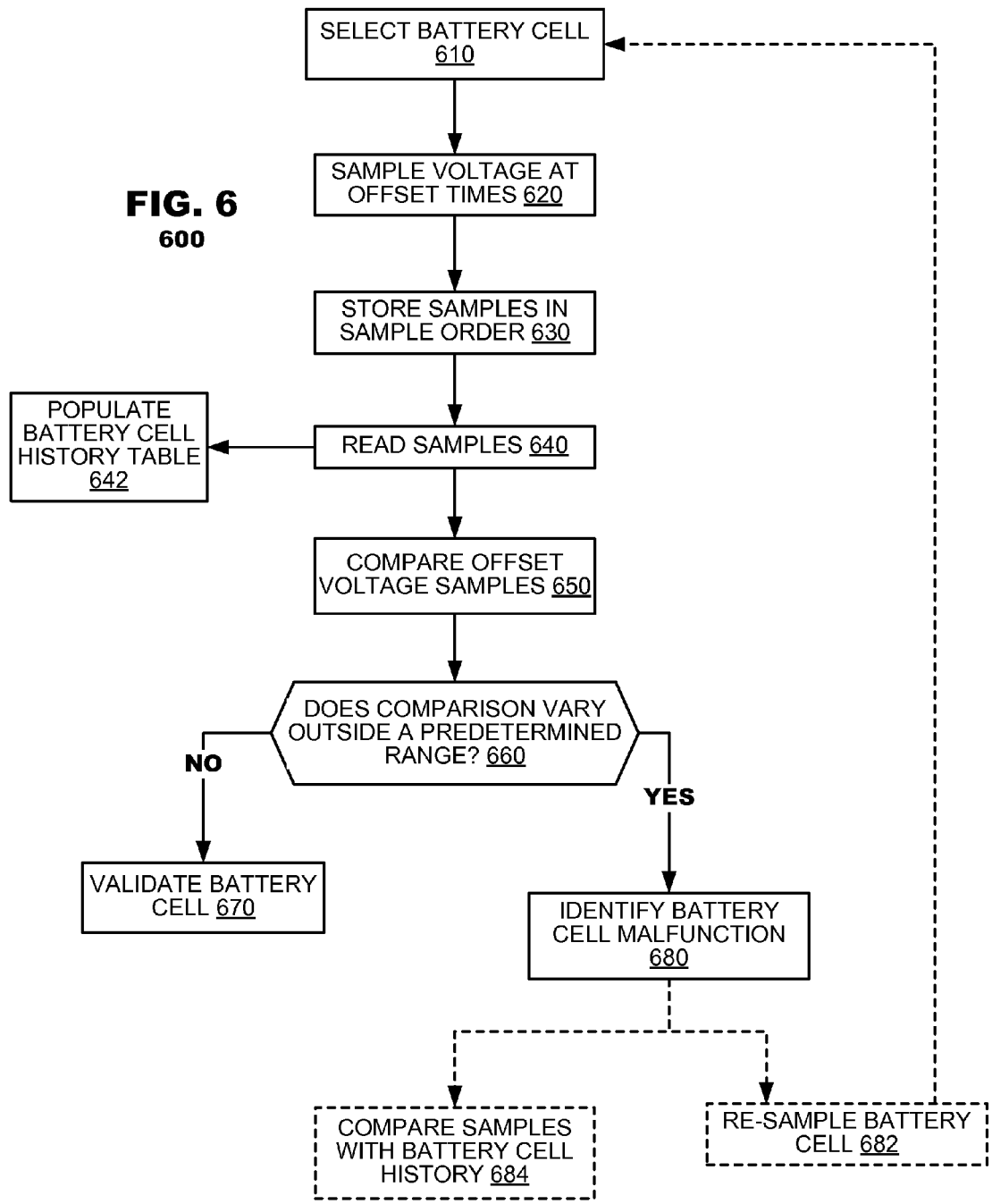
FIG. 6 illustrates a method for detecting a malfunctioning battery cell with a battery monitoring system according to an embodiment of the present invention.

FIG. 6 illustrates a method 600 for detecting a malfunctioning battery cell with a battery monitoring system according to an embodiment of the present invention. As illustrated in block 610, the detection method 600 may include selecting a respective battery cell for processing. Successive voltages for the cell may be sampled at offset times (block 620). The samples may be stored in a shift register in the order of sampling (block 630). The voltages may then be read out of the shift registers in the sampling order (block 640). The method 600 may populate a table that may maintain historical voltage samples for the respective sampled cell (block 642).

The voltages for the cell may then be compared between offset samples to generate a voltage difference (block 650). The voltage difference may then be compared against a predetermined range (block 660). If the voltage difference does not vary outside the predetermined range, then the method 600 may validate operation for the corresponding battery cell (block 670). If the voltage difference does vary outside the predetermined range, the method 600 may indicate a malfunction for the corresponding battery cell (block 680). In an embodiment, the method 600 may further cause the malfunctioning battery cell to be processed again (block 682, return to block 610). In another embodiment, the method 600 may compare voltage samples from the malfunctioning battery cell with historical voltages for that cell to generate a historical voltage range for the cell (block 684).

Figure 7:
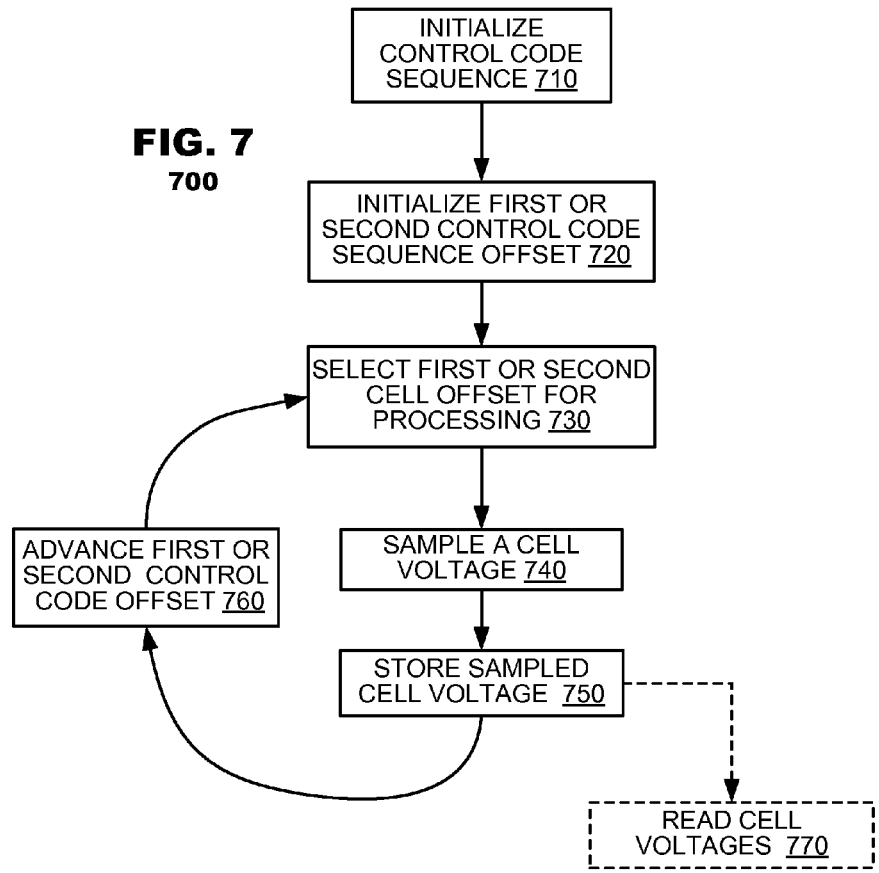
FIG. 7 illustrates a method for redundant battery cell monitoring in a monitoring loop according to an embodiment of the present invention.

FIG. 7 illustrates a method 700 for redundant battery cell monitoring in a monitoring loop according to an embodiment of the present invention. As illustrated in block 710, the method 700 may include initializing a control code sequence. A first or second offset for the control code sequence may then be initialized (block 720). A first or second offset battery cell may then be selected corresponding to the first or second control code offset for processing the respective battery cell voltage (block 730). A respective first or second offset battery cell voltage may then be sampled for generating a sampled voltage signal (block 740). The respective sampled voltage signal may then be stored in shift registers (block 750). The first or second control code offset may then be advanced to a subsequent first or second control code (block 760) and a subsequent first or second cell may be selected for processing from the advanced first or second control code (return to block 730).

According to the monitoring method 700, each of a battery channel in a battery cell array may be processed in a "round-robin" manner until the method may be terminated. In an embodiment, the method 700 may read the stored voltage samples for each of a respective battery channel for further processing (block 770).

Figure 8:
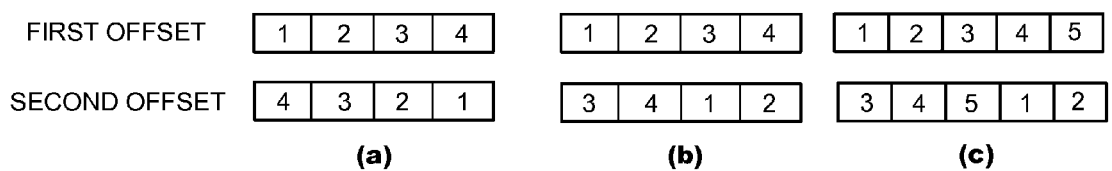
FIG. 8 illustrates exemplary control code sequences according to embodiments of the present invention.

FIG. 8 illustrates exemplary control code sequences 800 suitable for use with the foregoing embodiments of the present invention. The control code sequences may be configured with a first and second offset in any number of manners so long as neither offset may cause the same channel to be sampled at the same time by a battery monitor or ADC in a monitoring system. In an embodiment illustrated in FIG. 8(a), opposing ascending and descending control code sequences may be implemented with a first offset cycling through channels beginning with channel 4 and a second offset cycling through channels beginning with channel 1. A limitation to using opposing ascending and descending control code sequences, however, occurs when monitoring an odd number of channels. For example, using the opposing ascending and descending control sequences 1, 2, 3, 4, 5 and 5, 4, 3, 2, 1 for 5 channel devices may causes channel 3 to be sampled at the same time by each of a battery monitor or ADC.

In another embodiment illustrated in FIG. 8(b), a single control code sequence may be implemented with a predetermined first and second offset. For example, where N equals the number of battery channels for monitoring, say, 4, the first offset may be configured to start processing channel 1, while the second offset may be configured to start sampling channel 1+(N/2) (i.e., channel 3). As illustrated in FIG. 8(c), such an embodiment may not suffer from the same odd-channel limitation as described for opposing ascending and descending control code sequences illustrated in FIG. 8(a). For example, where N may equal 5 channels for monitoring, the first offset may be configured to start processing channel 1, while the second offset may be configured to start processing channel (N+1)/2 (i.e., channel 3). In the illustrated example, no channel may be processed at the same time by each of a battery monitor or ADC.

Figure 9:
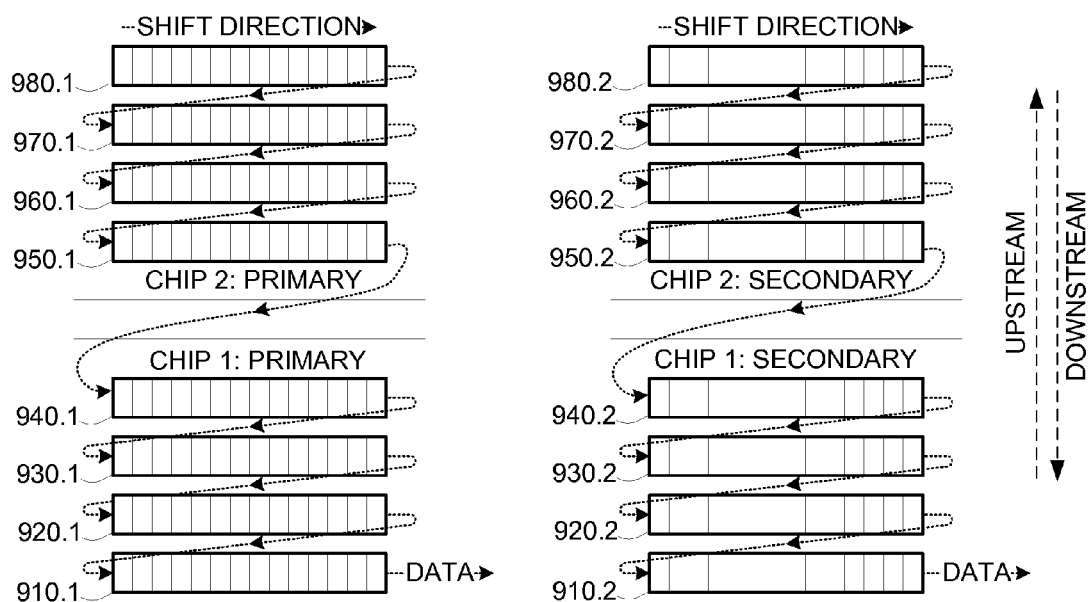
FIG. 9 illustrates exemplary register shifting operations performed on shift registers of a plurality of battery monitors according to an embodiment of the present invention.

FIG. 9 illustrates exemplary register shifting operations 900 performed on shift registers of a plurality of battery monitors according to an embodiment of the present invention. In an embodiment, each of a primary and secondary monitor may be implemented as an independent integrated circuit chip. Each of a primary chip and secondary chip may share a respective common communication link. In another embodiment, each of a primary and secondary monitor may be organized in a single integrated circuit chip with a respective primary and secondary communication link coupled to a processor.

As illustrated, registers 910.1-940.1 may reside in a primary chip 1 and registers 950.1-980.1 may reside in a primary chip 2. Similarly, registers 910.2-940.2 may reside in a secondary chip 1 and registers 950.2-980.2 may reside in a secondary chip 2. Data may be written to respective primary and secondary registers and shifted serially in a downstream manner. For example, data may be written to registers 910.1-940.1 within primary chip 1 by writing data into register 940.1 and causing the data to be shifted in a downstream manner. Similarly, data may be written to registers 950.1-980.1 within primary chip 2 by writing data into register 980.1 and causing the data to be shifted in a downstream manner.

During operation, data may be read from the serial shift of a respective primary or secondary monitor to a processor via a first or second serial communication link (not shown). For example, data stored within register 950.1 of primary chip 2 may be read from the register by shifting data from the register on each occurrence of a driving clock (not shown). Each clock may cause a shift by a single bit position in the downstream direction. As data may shift from the last bit position of an intermediate chip (i.e., register 950.1 of primary chip 2), it may be shifted to a first bit position of a first register 940.1 for primary chip 1 via a respective communication link (not shown). When a bit of data reaches a last bit position in the last register 910.1 of primary chip 1, it may be shifted to a processor via a respective communication link (not shown).

Figure 10:
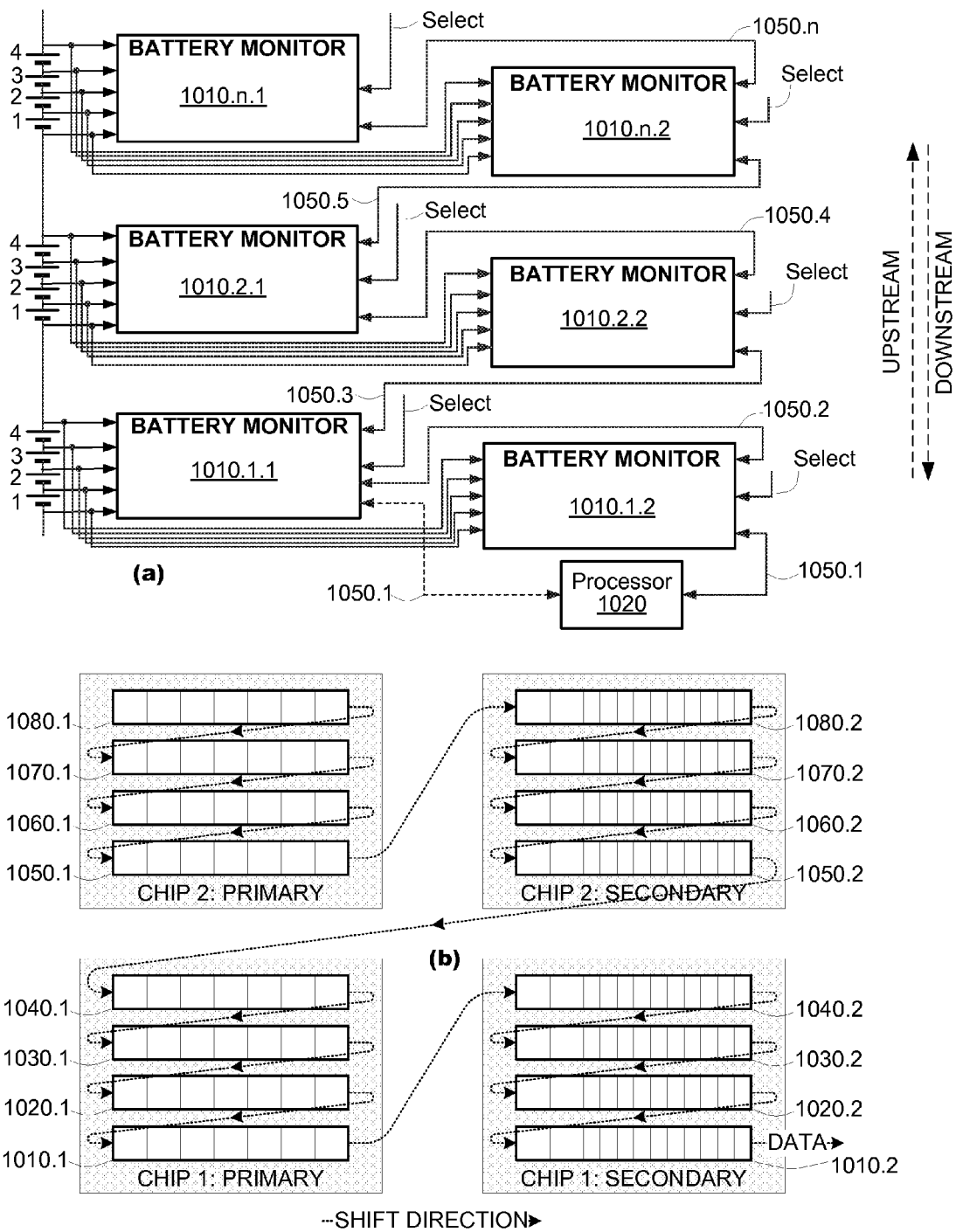
FIG. 10 illustrates a block diagram of a battery monitoring system and exemplary register shifting operation performed on shift registers of a plurality of battery monitors according to an embodiment of the present invention.

FIG. 10 illustrates a block diagram of a battery monitoring system and exemplary register shifting operation 1000 performed on shift registers of a plurality of battery monitors according to an embodiment of the present invention. In an embodiment, each of a primary and secondary monitor may be implemented as an independent integrated circuit chip. In another embodiment, each of the primary and secondary monitors may be organized in a single integrated circuit chip with a respective primary and secondary communication link coupled to a processor. As illustrated in FIG. 10(a), each of a plurality of primary monitor 1010.1.1-1010.n.1 and secondary monitor 1010.1.2-1010.n.2 may share a cascaded communication link 1050.1-1050.n provided in common to each of the monitors. In an embodiment, the link 1050.1 may be coupled to a processor 1020 via a secondary monitor 1010.1.2. In another embodiment, the link 1050.1 may be coupled to the processor 1020 via the primary monitor 1010.1.1.

FIG. 10(b) illustrates an exemplary register shifting operation performed on shift registers of a plurality of battery monitors according to an embodiment of FIG. 10(a). As illustrated, each of a primary and secondary monitor may be implemented as an independent integrated circuit chip. Registers 1010.1-1040.1 may reside in a primary chip 1 and registers 1050.1-1080.1 may reside in a primary chip 2. Similarly, registers 1010.2-1040.2 may reside in a secondary chip 1 and registers 1050.2-1080.2 may reside in a secondary chip 2. Data may be written to respective primary and secondary registers and shifted serially through a cascaded communication link (i.e., link 1050.1-1050.n of FIG. 10(a)) in a downstream manner.

For example, during operation, data stored within a register (say, 1050.1 of the second primary chip) may be read from the register by shifting data from the register on each occurrence of a driving clock (not shown). As data may shift from the last bit position of the register 1050.1 of the primary intermediate chip 2, it may be shifted to a first bit position of a first register 1080.2 of a subsequent secondary intermediate chip 2. When a bit of data reaches a last bit position of the last register 1050.2 of the secondary intermediate chip 2, it may be shifted further downstream to a first bit position of a first register 1040.1 of a subsequent primary chip 1. As a bit of data reaches a last bit position in the last register 1010.2 of the secondary chip 1 it may be shifted to a processor via a respective communication link.

FIG. 11 illustrates exemplary register shifting operations 1100 performed on shift registers of a plurality of battery monitors according to an embodiment of the present invention. In an embodiment, each monitor may be implemented as an independent integrated circuit chip having a pair of ADCs wherein each chip may share a respective common communication link. In another embodiment, each monitor may be organized in a single integrated circuit chip with a common communication link coupled to a processor.

As illustrated, registers 1110.1-1180.1 may reside in a first chip and registers 1110.2-1180.2 may reside in a second chip. Data may be written to respective registers of the first or second chip and shifted serially in a downstream manner. For example, data may be written to registers 1110.1-1180.1 within the first chip by writing data into register 1180.1 and causing the data to be shifted in a downstream serial manner. Similarly, data may be written to registers 1110.2-1180.2 within the second primary monitor by writing data into register 1180.2 and causing the data to be shifted in a downstream serial manner.

During operation, data may be read from the serial shift registers for a chip via a serial communication link (not shown). For example, data stored within register 1110.2 of the second chip may be read from the register by shifting data from the register on each occurrence of a driving clock (not shown). Each clock may cause a shift by a single bit position in the downstream direction. As data may shift from the last bit position of an intermediate chip (i.e., register 1110.2 of chip 2), it may be shifted to a first bit position of a first register 1180.1 for the first chip via a respective communication link (not shown). When a bit of data reaches a last bit position in the last register 1110.1 of the first chip, it may be shifted to a processor via a respective communication link (not shown).

Several embodiments of the present invention are specifically illustrated and described herein. However, it will be appreciated that modifications and variations of the present invention are covered by the above teachings and within the purview of the appended claims without departing from the spirit and intended scope of the invention.

We claim:

1. A control method for a battery monitoring system comprising a plurality of paired battery monitors, comprising:
   sampling, using a first battery monitor of the plurality of paired battery monitors a first voltage of a battery cell of a battery stack,
   sampling, using a second battery monitor of the plurality of paired battery monitors a second voltage of the battery cell, wherein the sampling of the battery cell by the second monitor is at sampling instant different from the sampling of the battery cell by the first battery monitor;
   comparing the first voltage and the second voltage; and
   identifying a battery stack malfunction responsive to the comparison of the first voltage and the second voltage of the battery cell.

2. A battery monitor system, comprising:
   a plurality of battery monitors, each having battery cell inputs for connection to respective cells of a battery system, the battery monitors including an analog-to-digital converter (ADC) and routing logic operationally coupling the battery cell inputs to the ADC during sampling, wherein a pair of battery monitors are provided for each cell; and
   control logic to: (i) define a sampling order of the battery cell inputs, the control logic initiating a control code sequence such that a first battery monitor samples a channel corresponding to a respective battery cell at a first sampling instance to obtain a first voltage sample and a second battery monitor samples the channel at a second sampling instance to obtain a second voltage sample, the first and second sampling instances being different from each other, and (ii) detect a battery stack malfunction based on a comparison of the first voltage sample and the second voltage sample.

3. A method for detecting a malfunctioning battery cell within a stack of battery cells with a pair of battery monitors, comprising:
sampling, using a first battery monitor, a first voltage sample of a battery cell;
sampling, using a second battery monitor, a second voltage sample of the battery cell, wherein the sampling of the battery cell by the second battery monitor is at sampling instant different from the sampling of the battery cell by the first battery monitor;
storing the first voltage sample in shift register(s) corresponding to the first battery monitor;
storing the second voltage sample in shift register(s) corresponding to the second battery monitor;
reading the stored first and second voltage samples out of the register(s); and
comparing the stored first and second voltage samples to generate a voltage difference: if the voltage difference varies outside a predetermined range, identify a malfunction of the battery cell.

4. The method of claim 3, the comparison of the stored first and second voltage samples further comprising, if the voltage difference varies outside a predetermined range, repeating the steps of:
the sampling using the first battery monitor;
the sampling using the second battery monitor;
the storing the first and second cell voltages;
reading the stored first and second voltage samples; and
the comparing the stored first and second voltage.

5. The method of claim 3, the comparing the stored first and second voltage samples further comprising:
if the voltage difference varies outside a predetermined range,
comparing the stored first and second voltage samples with historical voltages for the respective cell to generate a voltage range for the cell.

6. The method of claim 3, further comprising: maintaining a table with historical voltage values for each battery cell from the battery stack.

7. A method for redundant battery cell monitoring using a monitoring loop within a stack of battery cells, comprising:
initializing a control code sequence corresponding to a number of battery cells being monitored;
initializing a first and second offset for the control code sequence;
selecting a battery cell corresponding to the first and second control code offset;
sampling, using a first battery cell monitor, a first voltage of the battery cell corresponding to the first control code offset;
sampling, using a second battery cell monitor, a second voltage of the battery cell corresponding to the second control code offset;
storing the first and second battery cell voltage samples corresponding to the first and second control code offsets into shift register(s);
advancing the first or second control code offset; and
comparing the stored first and second battery cell voltage samples to determine whether a voltage difference for the selected battery cell is outside a predetermined range;
wherein the first and second control code offsets each defines an order of cycling through the battery cells, and the first and second control code offsets are selected such that at a common sampling instant, the battery cells being sampled by each of the first and second battery cell monitors are different from each other.

8. The method of claim 7, further comprising:
reading the stored battery cell voltage samples for further processing.

9. The method of claim 7, further comprising, following the advancing of the first or second control code offset, repeating the steps of:
the selecting a battery cell corresponding to the first or second control code offset,
the sampling the battery cell voltage,
the storing the battery cell voltage sample, and
the advancing the first or second control code offset until the method is terminated.

10. A battery monitor system, comprising:
a plurality of respective primary battery monitors, each respective primary battery monitor having:
inputs for a number of battery cells;
an input for a control pin;
an analog to digital converter provided in communication with the inputs; and
a register file having a plurality of shift registers;
a plurality of respective secondary battery monitors, each connected in parallel to each of a respective primary battery monitor inputs, each secondary battery monitor having:
inputs for a number of battery cells;
an input for a control pin;
an analog to digital converter provided in communication with the inputs; and
a register file having a plurality of shift registers;
primary and secondary serial communication links provided among the primary and secondary battery monitors to form a primary and secondary daisy chain communication link; and
a processor provided in common on one end of the primary and secondary daisy chain link; wherein the plurality of respective primary battery monitors and the plurality of secondary battery monitors are adapted to monitor the battery cells based on a predetermined battery cell monitoring sequence, the sequence being selected such that:
the primary monitor is assigned to a battery cell at a first processing cycle of the processor to sample and store a first voltage of the battery cell,
the second primary monitor is assigned to the battery cell at a second processing cycle of the processor different from the first processing cycle to sample and store a second voltage of the battery cell, and
a malfunction of the battery cell is based on a comparison between the first voltage and the second voltage.

11. The battery monitor system of claim 10, wherein each of the plurality of primary battery monitors is further adapted to monitor battery cells beginning with a respective primary offset battery cell number.

12. The battery monitor system of claim 11, wherein each of the plurality of secondary battery monitors is further adapted to monitor battery cells beginning with a respective secondary offset battery cell number.

13. The battery monitor system of claim 12, wherein the primary offset battery cell number and the secondary offset cell number correspond to different battery cells.

14. A battery monitor, comprising:
a multiplexer having inputs for connection to a predetermined number of battery cells;
a first and second analog to digital converter (ADC) each having an input coupled to an output of the multiplexer;

a controller coupled to the multiplexer, the controller loading at least two separate control code sequences such that the first ADC obtains a first sample of a battery cell at a first sampling instance and the second ADC obtains a second sample of the battery cell at a second sampling instance different from the first sampling instance, and detecting a malfunction of the battery cell responsive to a determination that a voltage difference between the first sample and the second sample is outside a predetermined range; and a register file having a plurality of shift registers, one shift register for each of a plurality of cells monitored by each of the first and second ADC.

15. The battery monitor of claim 14, wherein the controller is adapted to select battery cells monitored by each of the first and second ADCs.

16. A battery monitor system, comprising:

a plurality of battery monitors connected as a daisy chain, each battery monitor including:

inputs for a number of battery cells;

a first and second analog to digital converter (ADC) provided in parallel communication with the inputs, the ADCs being adapted to monitor battery cells based on at least one predetermined monitoring sequence;

a controller coupled to the multiplexer, the controller loading at least two separate control code sequences such that the first ADC obtains a first sample of a battery cell at a first sampling instance and the second ADC obtains a second sample of the battery cell at a second sampling instance different from the first sampling instance, and detecting a malfunction of the battery cell responsive to a determination that a voltage difference between the first sample and the second sample is outside a predetermined range; and a register file having a plurality of shift registers, one shift register for each of a plurality of battery cells monitored by each of the first and second ADC.

17. The battery monitor system of claim 16, wherein each of a respective first ADC further is adapted to monitor battery cells beginning with a first offset battery cell number.

18. The battery monitor system of claim 17, wherein each of a respective second ADC further being adapted to monitor battery cells beginning with a second offset battery cell number.

19. The battery monitor system of claim 18, wherein the first offset battery cell number and the second offset cell number correspond to different battery cells.

20. The method of claim 3, wherein the sampling instance of the second battery monitor is at least one processing cycle after the sampling instance of the first battery monitor.

21. The battery monitor of claim 14, further comprising a second multiplexer having inputs for outputs of the first and second ADCs and having outputs coupled to the register file.

22. The battery monitor system of claim 10, wherein the monitoring of each battery cell includes comparing samples of a voltage of the respective battery cell at at least two offset sampling times.

* * * * *